INTEGRATED CIRCUIT FABRICATION

Filed April 2, 1969

INVENTOR.
BRYAN H. HILL

BY Harry A. Herbert Jr

ATTORNEY

United States Patent Office 3,575,745

Patented Apr. 20, 1971

3,575,745
INTEGRATED CIRCUIT FABRICATION

Bryan H. Hill, 3213 Lipton Lane, Dayton, Ohio 45430

Filed Apr. 2, 1969, Ser. No. 812,791
Int. Cl. B32b *31/14;* H01l *7/50*
U.S. Cl. 156—3 5 Claims

ABSTRACT OF THE DISCLOSURE

A technique for fabricating integrated circuits. The technique takes advantage of the fact that certain oxides such as $Al_2O_3$ and $Ta_2O_5$ have their susceptibility to etching materials retarded by irradiation with an electron beam while other oxides such as $SiO_2$ have their susceptibility to etching materials enhanced by irradiation with an electron beam. By taking advantage of the above facts one can etch openings in selected areas of oxide layers without resorting to complicated masking techniques previously required.

BACKGROUND OF THE INVENTION

(1) Field of the invention

This invention is in the field of integrated circuit fabrication.

(2) Description of the prior art

It is well known in the prior art to use masking techniques in the preparation of integrated circuits. When masking techniques are used, usually a computer-controlled machine cuts a series of stencils which are photographically reduced by complicated photographic processes until they are small enough to fit the tiny chips which are to hold the integrated circuit. Once the stencils are prepared a series of etching and diffusion steps are performed, utilizing the masks or stencils to protect certain areas of the chips from etching and diffusion while not protecting other areas. The preparation of masks or stencils and their reduction to a usable size is exacting, time consuming work.

SUMMARY OF THE INVENTION

It is now possible to fabricate integrated circuits without going through the complicated photographic steps of the prior art. Masks are no longer necessary items in the fabrication of integrated circuits.

This invention is predicated on the fact that certain oxides, such as $SiO_2$, are made more susceptible to action by etching materials when the oxides have been subjected to irradiation by an electron beam and upon the further fact that certain other oxides, such as $Al_2O_3$ and $Ta_2O_5$, are made less susceptible to action by etching materials when the oxides have been subjected to electron beam irradiation. The use of combinations of the two types of oxides mentioned above as layers on a wafer enable one to fabricate integrated circuits much more easily than has been the case previously.

DESCRIPTION OF THE PREFERRED EMBODIMENT

Figure 1:
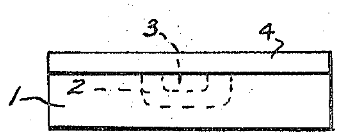
FIG. 1 shows a transistor having a collector, base and emitter.

In reading the description of how this invention may be practiced, the reader should keep in mind one fact. That fact is that the etch-rate of $Al_2O_3$ (or $Ta_2O_5$) is only retarded by subjecting $Al_2O_3$ (or $Ta_2O_5$) to an electron beam. That is, irradiated $Al_2O_3$ (or $Ta_2O_5$) may still be etched but with more difficulty and at a slower rate than unirradiated $Al_2O_3$ (or $Ta_2O_5$).

In order to make the present invention full understandable to one skilled in the art, let us consider a specific example. Let us consider the example of the transistor shown in FIG. 1 of the drawing. The transistor shown by FIG. 1 is a typical transistor having a collector 1, a base 2, an emitter 3, and a protective $SiO_2$ layer 4.

Figure 2:
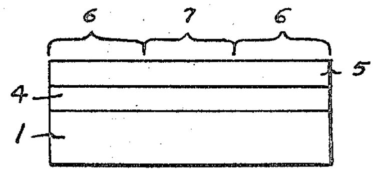
FIG. 2 shows a wafer (collector) with thin layers of $SiO_2$ and $Al_2O_3$ thereon. This figure is a starting point for the fabrication of the transistor of FIG. 1.

To fabricate the transistor shown by FIG. 1 let us pick, as a starting point, the structure shown by FIG. 2. The FIG. 2 structure may be easily prepared by known methods and consists of a wafer of p type material (collector 1) having deposited thereon a thin layer of $SiO_2$, 4, and a thin layer of $Al_2O_3$, 5. $Al_2O_3$ will be used as the example in this specification. However, $Ta_2O_5$ could be used in lieu of the $Al_2O_3$ and would work equally well.

The first step in preparing the structure of FIG. 1 starting with the structure of FIG. 2 is to irradiate the $Al_2O_3$ areas designated by the number 6 with an electron beam. Irradiation of areas 6 will make areas 6 etch-retarding. Area 7 is left unirradiated and is therefore not etch-retarding. After areas 6 have been irradiated (and area 7 left unirradiated) etching by conventional means is carried out and the structure shown by FIG. 3 results. (The characteristics of the electron beam and examples of etching materials will be given later in the specification.)

Figure 3:
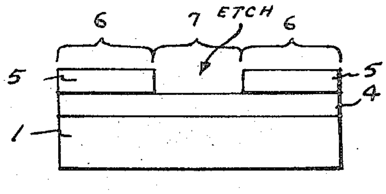
FIG. 3 shows the structure of FIG. 2 with a portion of the $Al_2O_3$ layer etched away, the unetched areas having been irradiated.

When one has obtained the structure of FIG. 3, wherein all numbers designate the same areas and parts as before, the next step is to irradiate area 7 of the $SiO_2$ layer. This irradiation enhances the susceptibility of area 7 to etching materials. Thus, etching may be easily carried out to arrive at the structure shown by FIG. 4.

Figure 4:
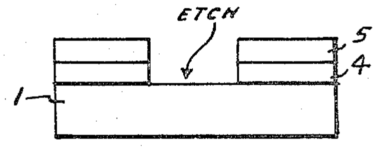
FIG. 4 shows the structure of FIG. 3 with a portion of the $SiO_2$ layer etched away.
Figure 5:
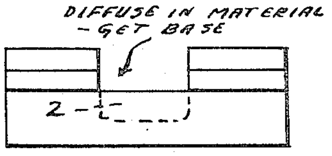
FIG. 5 shows the structure of FIG. 4 with material diffused into open areas to form a base.

FIG. 4 is self-explanatory and once arrived at it will be obvious to one skilled in the art to diffuse in a conventional dopant to form the base 2 and arrive at the structure shown by FIG. 5.

Figure 6:
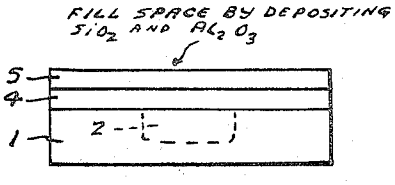
FIG. 6 shows new layers of $SiO_2$ and $Al_2O_3$ filling in the areas previously etched away.

To get to FIG. 6 from FIG. 5 the opening created in area 7 by previous etchings is filled with first a thin layer of $SiO_2$ and then a thin layer of $Al_2O_3$. The layers may be easily deposited by the same well-known techniques used to arrive at the structure shown in FIG. 2. It will be noted that FIG. 6 is the same as FIG. 2 except for the base 2 now present in FIG. 6.

Figure 7:
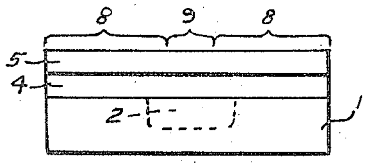
FIG. 7 shows the structure of FIG. 6 and points out areas of the $Al_2O_3$ area to be irradiated to retard etching.

After the structure shown by FIG. 6 is obtained, one irradiates areas 8 as shown in FIG. 7 and leaves area 9 unirradiated. After this irradiation, area 9 may be etched down to the $SiO_2$ layer 4 leaving areas 8 substantially unetched. Thus one arrives at the structure shown by FIG. 8.

Figure 8:
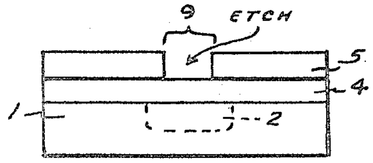
FIG. 8 shows the structure of FIG. 7 with the unirradiated portion of the $Al_2O_3$ layer etched away.
Figure 9:
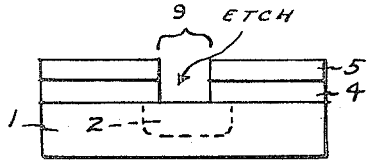
FIG. 9 shows the structure of FIG. 8 except that an area of the $SiO_2$ layer has been etched away.

To go from FIG. 8 to FIG. 9, one irradiates area 9 of FIG. 8 and etches.

Figure 10:
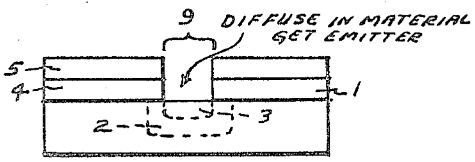
FIG. 10 shows the structure of FIG. 9 except that material has been diffused into the wafer to form an emitter.

To form the structure depicted by FIG. 10, one diffuses in a conventional dopant in a conventional manner to form an emitter area 3.

To go from FIG. 10 to FIG. 11, one again deposits a thin layer of $SiO_2$ in area 9 using any of a variety of well known methods.

Figure 11:
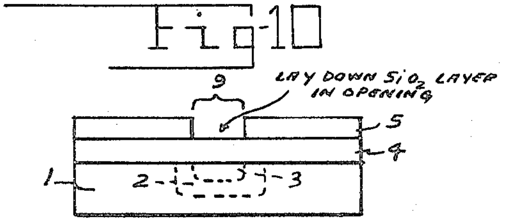
FIG. 11 shows the structure of FIG. 10 except that the etched away area of $SiO_2$ has been replaced by new $SiO_2$.

FIG. 11 shows the $Al_2O_4$ layer 5 as having its original thickness (the thickness of FIG. 2). In actual practice, this would not be the case. In actual practice the $Al_2O_3$ layer 5 (or $Ta_2O_5$) would be very nearly if not entirely etched away by previous etching steps by the time FIG. 11 was arrived at. Whether layer 5 was completely or only partially etched away by the time FIG. 11 was arrived at would, of course, depend on the original thickness of layer 5, the strength of the etching material used in $Al_2O_3$ (or $Ta_2O_5$) etching steps, and the time used to carry out the $Al_2O_3$ etching steps. If a very thin layer 5 still remains and if it is desirable to remove that remaining thin layer 5, conventional etching materials, vigorously applied will enable one to arrive at the structure shown in FIG. 1 from FIG. 11.

It will be obvious to those skilled in the art that no contacts are shown in the figures. It will be just as obvious to those skilled in the art that openings for a collector contact, a base contact, and an emitter contact could easily be made in the same manner as were the openings for the dopants. On the other hand, one photographic mask could easily be made up to allow for etching and the insertion of the contacts.

The following are formulations by which etchants for use on the oxide films of this invention may be made up.

Etchant for $SiO_2$ at room temperature:

1.5 cc. of hydrofluoric acid (48%)
10 cc. of nitric acid (70%)
300 cc. of deionized water.

Etchant for $Al_2O_3$ at 70° C.

Phosphoric acid (85%).

Etchant for $Ta_2O_5$ at room temperature:

200 cc. of hydrofluoric acid (48%)
80 grams of ammonium fluoride (solid)
20 cc. of deionized water.

The oxide layers of FIG. 2 and of subsequent figures may be laid down by sputtering techniques or by vacuum deposition, either of which is well known in the art. The original $Al_2O_3$ (or $Ta_2O_5$) layer of FIG. 2 should be in the range of from about 2500 A. to about 8000 A. thick. The $SiO_2$ layer should be in the range of from about 6000 A. to about 8000 A. thick.

The electron beam used to make the films etch-retarding or to enhance the etch rate my come from a scanning electron microscope. The electron beam should have beam energies in the 15 to 20 kev. range and beam currents in the $10^{-6}$ to $10^{-7}$ ampere range. The oxides disclosed above reach saturation between 1.5 and 2.5 coulombs per square centimeter. That is, charge saturation beyond 1.5 to 2.5 C./cm.$^2$ does not give further retardation or enhancement effects. The energies, currents, and charge saturation of this disclosure do not appear to have a deleterious effect on the underlying semiconductor substrate. If harm to the underlying substrate should occur it could easily be repaired by annealing.

The time required for irradiation of oxide layers having the thickness disclosed above was about 20 minutes. Irradiation beyond this period of time does not appear to provide any useful results.

What is claimed is:

1. The method of opening a discretionary opening in a first oxide layer and a second oxide layer, said first oxide layer being of a material selected from the group consisting of $Al_2O_3$ and $Ta_2O_5$ and said second oxide layer being of $SiO_2$; said method comprising the steps of:

(a) irradiating all portions of said first oxide except that portion where the discretionary opening is desired with an electron beam having electron beam energies in the 15–20 kev. range;

(b) subjecting said first oxide layer to the action of an etchant until that portion not irradiated is etched away and exposing said second oxide layer;

(c) subjecting the exposed part of said second oxide layer to an electron beam irradiation; and (d) subjecting said exposed part of said second oxide layer to action by an etchant until said exposed part of said second oxide layer is etched away.

2. The method of claim 1 wherein said first oxide layer is $Al_2O_3$ and has a thickness in the range of about 2500 A. to about 8000 A.

3. The method of claim 1 wherein said first oxide layer is $Ta_2O_5$ and has a thickness in the range of about 2500 A. to about 8000 A.

4. The method of claim 2 wherein said second oxide layer has a thickness in the range of about 6000 A. to about 8000 A.

5. The method of claim 3 wherein said second oxide layer has a thickness in the range of about 6000 A. to about 8000 A.

References Cited

UNITED STATES PATENTS

| | | | |
|---|---|---|---|
| 3,335,278 | 8/1967 | Price et al. | 250—83.1 |
| 3,458,368 | 7/1969 | Haberecht | 117—212 |
| 3,388,000 | 6/1968 | Waters et al. | 117—215 |
| 3,445,926 | 5/1969 | Medved et al. | 29—578 |

ROBERT F. BURNETT, Primary Examiner

R. J. ROCHE, Assistant Examiner

U.S. Cl. X.R.

29—624; 117—107, 215; 148—1.5, 187; 156—17